(12) United States Patent
Nakashima et al.

(10) Patent No.: US 8,802,458 B2
(45) Date of Patent: Aug. 12, 2014

(54) LASER DIODE AND METHOD OF MANUFACTURING THE SAME

(75) Inventors: Makoto Nakashima, Miyagi (JP);
Takahiro Yokoyama, Miyagi (JP);
Sachio Karino, Miyagi (JP)

(73) Assignee: Sony Corporation, Tokyo (JP)

( * ) Notice: Subject to any disclaimer, the term of this patent is extended or adjusted under 35 U.S.C. 154(b) by 361 days.

(21) Appl. No.: 13/348,501

(22) Filed: Jan. 11, 2012

(65) Prior Publication Data

US 2012/0107972 A1    May 3, 2012

Related U.S. Application Data

(62) Division of application No. 12/604,853, filed on Oct. 23, 2009, now Pat. No. 8,130,804.

(30) Foreign Application Priority Data

Oct. 30, 2008 (JP) ................. P2008-279861
May 29, 2009 (JP) ................. P2009-131264

(51) Int. Cl.
*H01L 33/36* (2010.01)
(52) U.S. Cl.
USPC .......................................... 438/22

(58) Field of Classification Search
None
See application file for complete search history.

(56) References Cited

U.S. PATENT DOCUMENTS 8,130,804 B2 * 3/2012 Nakashima et al. ..... 372/46.014

FOREIGN PATENT DOCUMENTS

JP    2000-269601    9/2000

* cited by examiner

*Primary Examiner* — Seahvosh Nikmanesh
(74) *Attorney, Agent, or Firm* — Dentons US LLP

(57) ABSTRACT

A laser diode capable of independently driving each ridge section, and inhibiting rotation of a polarization angle resulting from a stress applied to the ridge section without lowering reliability and a method of manufacturing the same are provided. A laser diode includes: three or more strip-like ridge sections in parallel with each other with a strip-like trench in between, including at least a lower cladding layer, an active layer, and an upper cladding layer in this order; an upper electrode on a top face of each ridge section, being electrically connected to the upper cladding layer; a wiring layer electrically connected to the upper electrode, in the air at least over the trench; and a pad electrode in a region different from regions of both the ridge section and the trench, being electrically connected to the upper electrode through the wiring layer.

5 Claims, 14 Drawing Sheets

LASER DIODE AND METHOD OF MANUFACTURING THE SAME

CROSS-REFERENCE TO RELATED APPLICATIONS

This application is a division of U.S. application Ser. No. 12/604,853, entitled "LASER DIODE AND METHOD OF MANUFACTURING THE SAME," filed on Oct. 23, 2009, now U.S. Pat. No. 8,130,804 issued on Mar. 6, 2012, the entirety of which is incorporated herein by reference to the extent permitted by law. The present invention claims priority to Japanese Application No. 2008-279861, filed on Oct. 30, 2008 and Japanese Patent Application No. 2009-131264, filed on May 29, 2009, the entireties of which are also incorporated herein by reference to the extent permitted by law.

FIELD OF THE INVENTION

The present invention relates to a laser diode capable of driving each emitter independently and a method of manufacturing the same.

BACKGROUND OF THE INVENTION

In a laser diode, in order to drive each emitter independently, an isolation trench to electrically isolate each emitter from an adjacent emitter is provided between emitters adjacent to each other. The width of the isolation trench varies according to the laser type. In the case of a narrow pitch type laser in which the beam pitch is about several tens of μm, the width of the isolation trench is only about several μm. Thus, in such a case, it is extremely difficult to provide a wiring layer that links a stripe electrode on the emitter (ridge section) with the both sides surrounded by the isolation trench, to a pad electrode formed in a location apart from the ridge section in the narrow isolation trench. Therefore, as described in Japanese Unexamined Patent Application Publication No. 2000-269601, in general, an insulating material is embedded in the isolation trench, and the foregoing wiring layer is provided on the insulating material.

SUMMARY OF THE INVENTION

However, in the case where the insulating material is embedded in the isolation trench, a stress is applied to the ridge section due to shrinkage and strain of the embedded insulating material, and a polarization angle of a laser beam radiated from the ridge section is easily rotated. Further, in the case where a deep isolation trench is formed, a step of embedding the insulating material becomes complicated, causing high production cost.

Thus, for example, as an alternative method, there is a method in which the insulating material is not embedded in the isolation trench, but a wire is connected to each stripe. However, in the case where the beam pitch is narrow as described above, one wire ball is contacted with a plurality of stripe electrodes, and each ridge section is not able to be driven independently. Further, since ultrasonic bonding is used in wire bonding, there is a possibility that lowering of reliability resulting from ultrasonic is caused. Accordingly, such a method is not able to be an effective means for solving the disadvantages.

In view of such disadvantages, in the invention, it is desirable to provide a laser diode capable of driving each ridge section independently, and inhibiting rotation of the polarization angle resulting from the stress applied to the ridge section without lowering reliability, and a method of manufacturing the same.

According to an embodiment of the invention, there is provided a first laser diode including three or more strip-like ridge sections that include at least a lower cladding layer, an active layer, and an upper cladding layer in this order. The three or more ridge sections are arranged in parallel with each other with a strip-like trench in between. On a top face of each ridge section, an upper electrode electrically connected to the upper cladding layer is provided. A wiring layer is electrically connected to the upper electrode. The wiring layer is arranged in the air at least over the trench. Further, a pad electrode is provided in a region different from regions of both the ridge section and the trench. The pad electrode is electrically connected to the upper electrode through the wiring layer.

According to an embodiment of the invention, there is provided a second laser diode including two strip-like ridge sections that include at least a lower cladding layer, an active layer, and an upper cladding layer in this order. The two ridge sections are arranged in parallel with each other with a strip-like trench in between. On a top face of each ridge section, an upper electrode electrically connected to the upper cladding layer is provided. A wiring layer is electrically connected to the upper electrode. The wiring layer is arranged in the air at least over the trench. Further, a pad electrode is provided only in one region out of two regions sandwiching the ridge section and the trench from the both sides. The pad electrode is electrically connected to the upper electrode through the wiring layer.

In the first and the second laser diodes according to the embodiments of the invention, the trench is provided between the ridge sections adjacent to each other. The wiring layer that electrically connects the upper electrode to the pad electrode is arranged in the air at least over the trench. That is, in the laser diode, a filler such as an insulating material is not provided in a clearance between the wiring layer and walls of the trench.

According to an embodiment of the invention, there is provided a first method of manufacturing a laser diode including the following respective steps A1 to A3:

A1. a first step of forming on a semiconductor substrate, three or more strip-like ridge sections in parallel with each other with a strip-like trench in between, the three or more strip-like ridge sections including at least a lower cladding layer, an active layer, and an upper cladding layer in this order from the semiconductor substrate side;

A2. a second step of forming a sacrifice layer that fills in at least an inside of the trench and that does not cover a whole top face of the ridge section, subsequently forming a wiring layer electrically connected to the upper cladding layer on the sacrifice layer according to needs, and forming a pad electrode electrically connected to the upper electrode through the wiring layer, in a region different from regions of both the ridge section and the trench; and A3. a third step of removing the sacrifice layer.

According to an embodiment of the invention, there is provided a second method of manufacturing a laser diode including the following respective steps B1 to B3:

B1. a first step of forming on a semiconductor substrate, two strip-like ridge sections in parallel with each other with a strip-like trench in between, the two strip-like ridge sections including at least a lower cladding layer, an active layer, and an upper cladding layer in this order from the semiconductor substrate side;

B2. a second step of forming a sacrifice layer that fills in at least an inside of the trench and that does not cover a whole top face of the ridge section, subsequently forming a wiring layer electrically connected to the upper cladding layer on the sacrifice layer according to needs, and forming a pad electrode electrically connected to the upper electrode through the wiring layer, only in one region out of two regions sandwiching the ridge section and the trench from the both sides; and B3. a third step of removing the sacrifice layer.

In the first and the second methods of manufacturing a laser diode according to the embodiments of the invention, the trench is formed between the ridge sections adjacent to each other. The wiring layer that electrically connects the upper electrode to the pad electrode is formed in the air at least over the trench by removing the sacrifice layer. That is, in the methods of manufacturing a laser diode, the sacrifice layer is not left in a clearance between the wiring layer and inner walls of the trench.

According to the first and the second laser diodes of the embodiments of the invention, the trench is provided between the ridge sections adjacent to each other. The wiring layer that electrically connects the upper electrode to the pad electrode is arranged in the air at least over the trench. Thus, there is no possibility that a stress generated in the case where a filler such as an insulating material is provided in the clearance between the wiring layer and the inner walls of the trench is not generated in the ridge section. Further, in the case where the foregoing wiring layer is formed by film formation, in the manufacturing process, there is no possibility that each wiring layer is contacted with each other, or reliability resulting from ultrasonic is lowered. Therefore, each ridge section is able to be driven independently, and rotation of a polarization angle resulting from the stress applied to the ridge section is able to be inhibited without lowering reliability.

According to the first and the second methods of manufacturing a laser diode of the embodiments of the invention, the trench is formed between the ridge sections adjacent to each other. The wiring layer that electrically connects the upper cladding layer to the pad electrode is formed in the air at least over the trench by removing the sacrifice layer. Thus, there is no possibility that a stress generated in the case where a filler such as an insulating material is provided in the clearance between the wiring layer and the inner walls of the trench is not generated in the ridge section. Further, in the case where the foregoing wiring layer is formed by film formation, in the manufacturing process, there is no possibility that each wiring layer is contacted with each other, or reliability resulting from ultrasonic is lowered. Therefore, each ridge section is able to be driven independently, and rotation of a polarization angle resulting from the stress applied to the ridge section is able to be inhibited without lowering reliability.

Other and further objects, features and advantages of the invention will appear more fully from the following description.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DETAILED DESCRIPTION OF THE INVENTION

Descriptions will be given of embodiments of the invention in detail with reference to the drawings. The descriptions will be given in the following order.

1. First embodiment

Example of a case that pad electrodes are formed on the both sides of ridge sections Example of a case that a wiring layer overjumps one trench at a time 2. Second embodiment Example of a case that the pad electrodes are formed only on a single side out of the both sides of the ridge sections Example of a case that the wiring layer overjumps one trench at a time 3. Modified example (example of a case that the wiring layer overjumps two trenches at a time)

4. Modified example (example of a case that the wiring layer is configured of a plurality of wires)

5. Modified example (example of a case that the wiring layer is provided with a hole)

6. Modified example (example of a case that the surface of the wiring layer is covered with an insulating film)

7. Modified example (example of a case that the wiring layer and an upper electrode are formed in block)

First Embodiment

Figure 1:
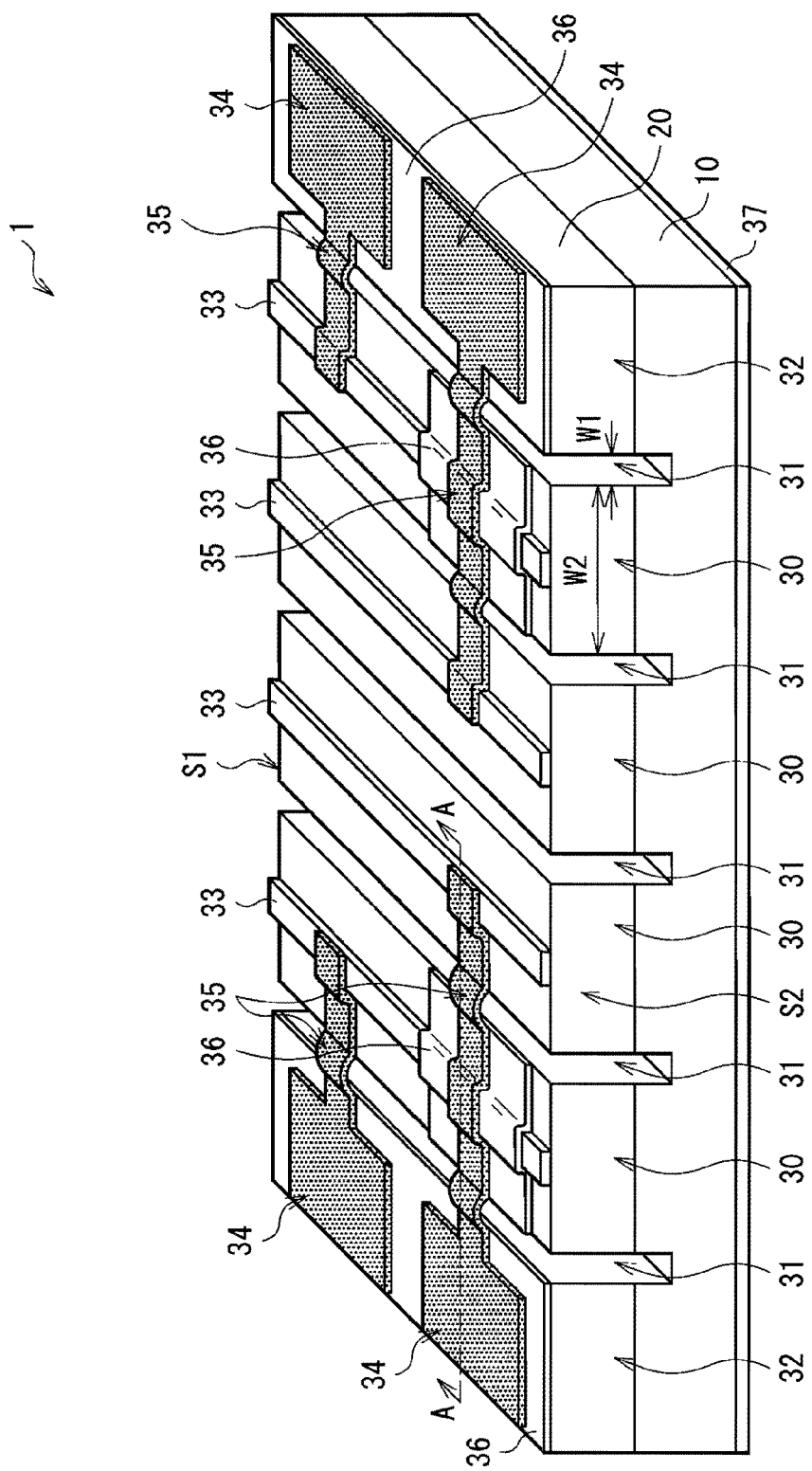
FIG. 1 is a perspective view of a laser diode according to a first embodiment of the invention.
Figure 2:
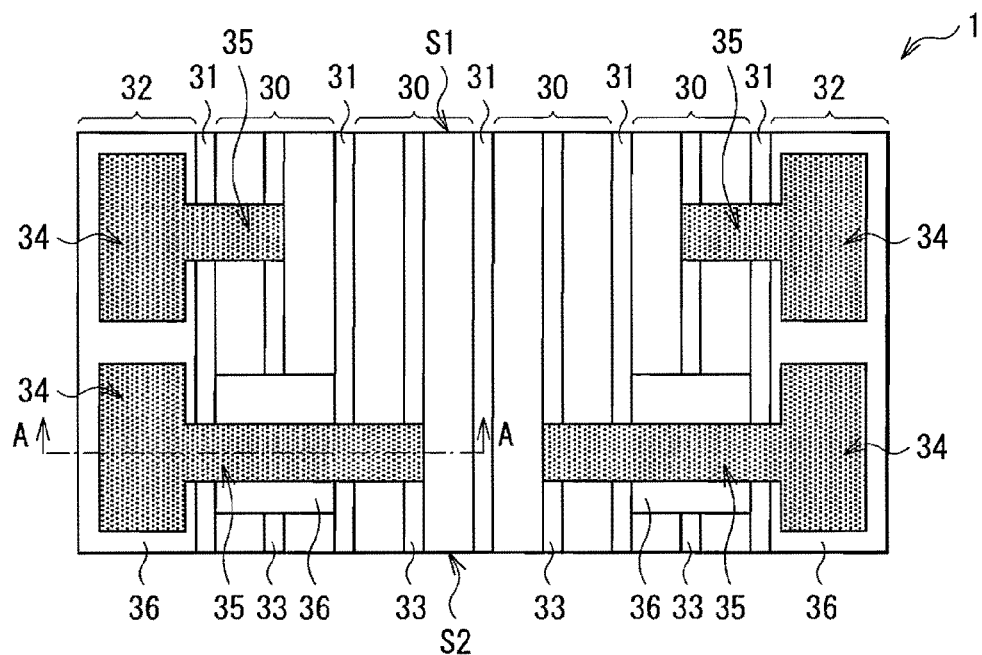
FIG. 2 is a top view of the laser diode of FIG. 1.
Figure 3:
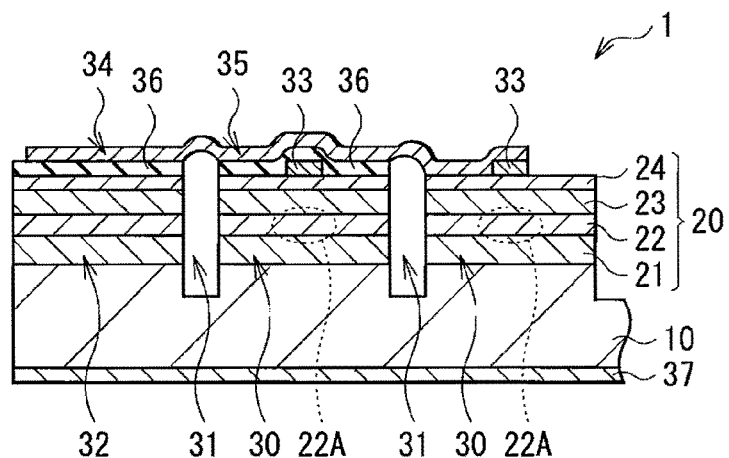
FIG. 3 is a cross sectional view taken along arrow A-A of the laser diode of FIG. 1 or FIG. 2.

FIG. 1 is a perspective view illustrating an example of schematic structure of a laser diode 1 according to a first embodiment of the invention. FIG. 2 illustrates an example of top face structure of the laser diode 1 of FIG. 1. FIG. 3 illustrates an example of cross sectional structure taken along arrow A-A of the laser diode 1 of FIG. 1 or FIG. 2. The laser diode 1 according to this embodiment is a multibeam laser diode including a plurality of stripe-like emitters, and an edge emitting type laser diode in which a laser beam is radiated from an end face of each emitter.

The laser diode 1 of this embodiment includes, for example, a semiconductor layer 20 including a lower cladding layer 21, an active layer 22, an upper cladding layer 23, and a contact layer 24 in this order from the substrate 10 side over a substrate 10. Though not illustrated, the semiconductor layer 20 may be further provided with a layer other than the foregoing layers (for example, a buffer layer, a guide layer and the like). In the semiconductor layer 20, three or more strip-like ridge sections 30 are arranged in parallel with each other. Each ridge section 30 functions as an emitter that radiates a laser beam from a front end face S1 independently from each other. Though FIG. 1 and FIG. 2 exemplify a case that the number of the ridge sections 30 is four, the number of the ridge sections 30 may be three or five or more.

Out of the ridge sections 30 provided in the upper section of the semiconductor layer 20, at least for the ridge section 30 other than the ridge sections 30 on the both ends in the arrangement direction, the both side faces are surrounded by a strip-like trench 31. FIG. 1 and FIG. 2 exemplify a case that a strip-like seat section 32 having a height equal to that of the ridge section 30 is provided on the both end sections in the arrangement direction of the ridge section 30, and the both side faces of the all ridge sections 30 are surrounded by the strip-like trench 31. Further, though FIG. 1 and FIG. 2 exemplify a case that the trench 31 reaches the upper section of the substrate 10, and the semiconductor layer 20 is spatially separated by the trench 31, it is possible that the trench 31 does not reach the substrate 10, and that the semiconductor layer 20 is not spatially separated at all points by the trench 31. However, in this case, it is preferable that the trench 31 has a depth with which electric crosstalk is not generated between the ridge sections 30 adjacent to each other (for example, reaching the lower cladding layer 21).

A width W1 of the trench 31 (width in the direction perpendicular to the extension direction of the trench 31) is narrower than a width W2 of the ridge section 30 (width in the direction perpendicular to the extension direction of the ridge section 30 (resonator direction)). Specifically, in the case where the width W2 of the ridge section 30 is about several tens of μm (for example, 30 μm), the width W1 of the trench 31 is about several μm (for example, 3 μm). That is, the laser diode 1 of this embodiment is a narrow pitch type laser in which the beam pitch is about several tens of μm.

In each ridge section 30, a pair of front end face S1 and a rear end face S2 sandwiching the ridge section 30 from the extension direction of the ridge section 30 is formed. A resonator is configured of the front end face S1 and the rear end face S2. The pair of the front end face S1 and the rear end face S2 is formed by, for example, cleavage. The front end face S1 and the rear end face S2 are arranged oppositely to each other with a given clearance in between. Further, a low reflection film (not illustrated) is formed in the front end face S1, and a high reflection film (not illustrated) is formed in the rear end face S2.

The ridge section 30 includes at least the upper section of the lower cladding layer 21, the active layer 22, the upper cladding layer 23, and the contact layer 24. FIG. 3 exemplifies a case that the ridge section 30 includes the upper section of the substrate 10, the lower cladding layer 21, the active layer 22, the upper cladding layer 23, and the contact layer 24.

The substrate 10 is configured of, for example, p-type GaAs. Examples of p-type impurity include, for example, magnesium (Mg), zinc (Zn) and the like. The lower cladding layer 21 is configured of, for example, p-type AlGaAs. The active layer 22 is configured of, for example, undoped AlGaAs. Out of the active layer 22, a strip-like region including a region opposed to an after-mentioned upper electrode 33 is a light emission region 22A. The light emission region 22A corresponds to a current injection region into which a current from the upper electrode 33 is injected. The upper cladding layer 23 is configured of, for example, n-type AlGaAs. The contact layer 24 is configured of, for example, n-type GaAs. Examples of n-type impurities include, for example, silicon (Si) and selenium (Se).

On the top face of each ridge section 30 (top face of the contact layer 24), the upper electrode 33 is provided. For example, as illustrated in FIG. 1 and FIG. 2, the upper electrode 33 is in the shape of a strip extending in the extension direction of the ridge section 30, and is electrically connected to the contact layer 24 and the upper cladding layer 23. Further, on a region different from that of both the ridge section 30 and the trench 31, that is, on the seat section 32, a pad electrode 34 is provided. Between the pad electrode 34 and the seat section 32, an insulating layer 36 is provided. The pad electrode 34 is insulated from the seat section 32 (in particular, the lower cladding layer 21). In the case where a current is hardly flown between the pad electrode 34 and the lower cladding layer 21, for example, in the case where a section directly below the pad electrode 34 out of the seat section 32 is highly resistive, the insulating layer 36 between the pad electrode 34 and the seat section 32 is able to be omitted. Further, the pad electrode 34 is connected to an after-mentioned wiring layer 35, and is electrically connected to the upper electrode 33 through the wiring layer 35. For example, as illustrated in FIG. 1 and FIG. 2, the plurality of pad electrodes 34 are respectively formed in both two regions sandwiching the ridge section 30 and the trench 31 from the both sides (seat section 32). For example, as illustrated in FIG. 1 and FIG. 2, the plurality of pad electrodes 34 are arranged in line in the direction in parallel with the ridge section 30. The plurality of pad electrodes 34 may be arranged alternately (staggeringly) in the extension direction of the ridge section 30. Further, for example, as illustrated in FIG. 1 and FIG. 2, the pad electrodes 34 are respectively formed in a region where a distance of the wiring layer 35 is shortest (seat section 32) out of the two regions sandwiching the ridge section 30 and the trench 31 from the both sides (seat section 32). For example, as illustrated in FIG. 1 and FIG. 2, the pad electrode 34 is in the shape of a quadrangle. The pad electrode 34 may have other shape. For example, the pad electrode 34 may be in the shape of a circle or an oval. Further, for example, the pad electrode 34 may be in the shape of a polygon such as a triangle.

The insulating layer 36 is also provided on respective surfaces of a ridge section 30 (second ridge section) other than a ridge section 30 (first ridge section) located in the center in the arrangement direction out of the three or more ridge sections 30, and the upper electrode 33 on the ridge section 30 (second ridge section), according to needs. For example, as illustrated in FIG. 1 and FIG. 2, the insulating layer 36 is provided between the wiring layer 35 connected to the upper electrode 33 on the ridge section 30 located in the center in the arrangement direction out of the three or more ridge sections 30 (hereinafter referred to as the central ridge section 30) and the top face of the ridge section 30 other than the central ridge section 30 out of the three or more ridge sections 30 (hereinafter referred to as the ridge section 30 other than the central ridge section 30)/the upper electrode 33 on the ridge section 30 other than the central ridge section 30. Thereby, the wiring layer 35 connected to the upper electrode 33 on the central ridge section 30 is insulated from the top face of the ridge section 30 other than the central ridge section 30 and the upper electrode 33 on the ridge section 30 other than the central ridge section 30.

The wiring layer 35 is connected to the upper electrode 33 on the ridge section 30 and the pad electrode 34, and electrically connects the upper electrode 33 on the ridge section 30 to the pad electrode 34. For example, as illustrated in FIG. 1 and FIG. 2, the wiring layer 35 is in the shape of a strip extending in the direction crossing (perpendicular to) the extension direction of the ridge section 30 and the trench 31. For example, the wiring layer 35 is formed by film formation. The wiring layer 35 overjumps one trench 31 at a time, and is arranged in the air at least over the trench 31. For example, as illustrated in FIG. 1 and FIG. 3, a section arranged in the air out of the wiring layer 35 is in the shape of an arch projecting on the opposite side of the bottom face of the trench 31, which is a structure to decrease a possibility of being bent. FIG. 1 and FIG. 2 exemplify a case that a section not arranged in the air out of the wiring layer 35 is formed being contacted with the surface of the insulating layer 36.

Further, on the rear face of the substrate 10, a lower electrode 37 is provided. The lower electrode 37 is formed, for example, on the whole rear face of the substrate 10, and is electrically connected to the substrate 10. The lower electrode 37 may be provided separately for every ridge section 30 as the upper electrode 33 is.

The upper electrode 33, the pad electrode 34, and the wiring layer 35 are structured by layering, for example, an alloy of gold (Au) and germanium (Ge), nickel (Ni), and gold (Au) in this order from the substrate 10 side. The upper electrode 33, the pad electrode 34, and the wiring layer 35 may be a laminated body made of a material other than the foregoing materials. Further, the upper electrode 33, the pad electrode 34, and the wiring layer 35 may be made of the same material, or may be made of a material different from each other. The insulating layer 36 is configured of, for example, SiN, SiO2, SiON, Al2O3, or AlN. The lower electrode 37 is structured by layering, for example, titanium (Ti), platinum (Pt), and gold (Au) in this order from the top face side of the ridge section 30.

Next, a description will be given of an example of a method of manufacturing the laser diode 1 of this embodiment with reference to FIG. 4 to FIGS. 9A and 9B. FIG. 4 to FIG. 9A are perspective views of a device in the manufacturing process. FIG. 9B is a cross sectional view of the device illustrated in FIG. 9A.

Figure 4:
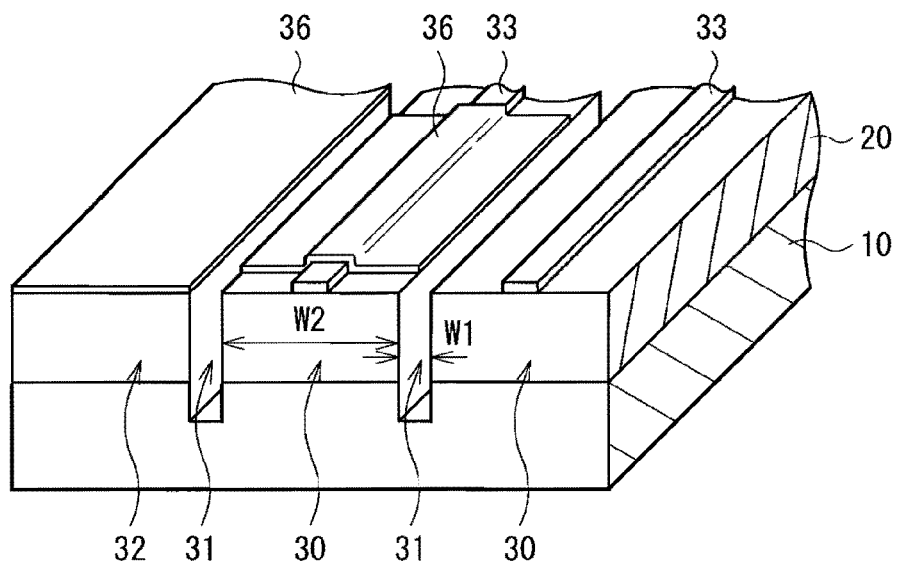
FIG. 4 is a perspective view for explaining an example of a method of manufacturing the laser diode of FIG. 1.
Figure 5:
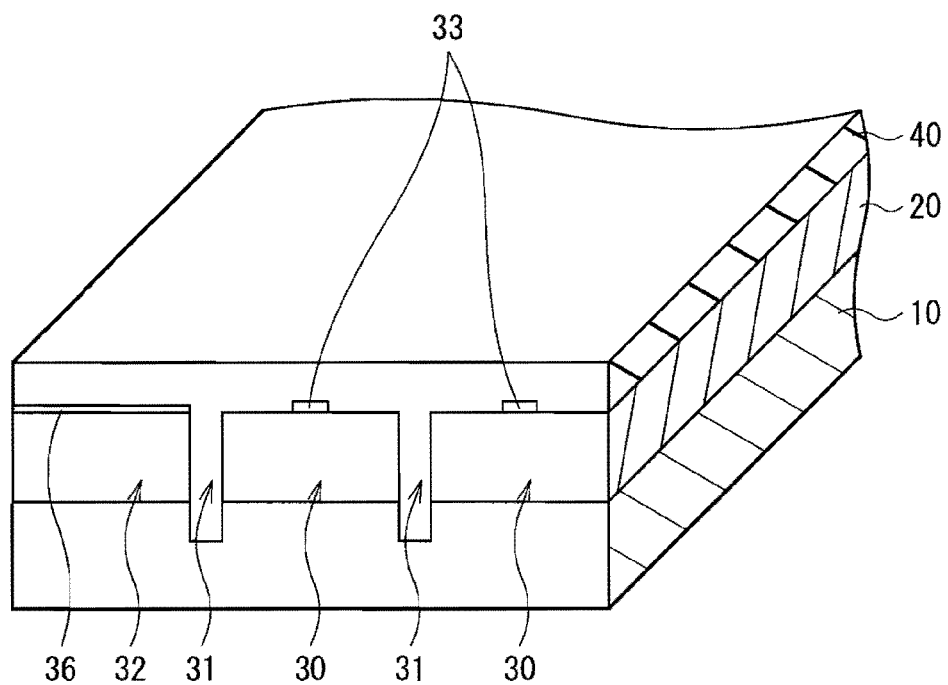
FIG. 5 is a perspective view for explaining a step following FIG. 4.

First, on the substrate 10, the three or more strip-like ridge sections 30 are formed in parallel with each other with the strip-like trench 31 in between (FIG. 4). At this time, the ridge section 30 and the trench 31 are formed so that the width W1 of the trench 31 is narrower than the width W2 of the ridge section 30. Next, after the upper electrode 33 is formed on each ridge section 30, the insulating layer 36 is formed in a given region (FIG. 4).

Figure 6:
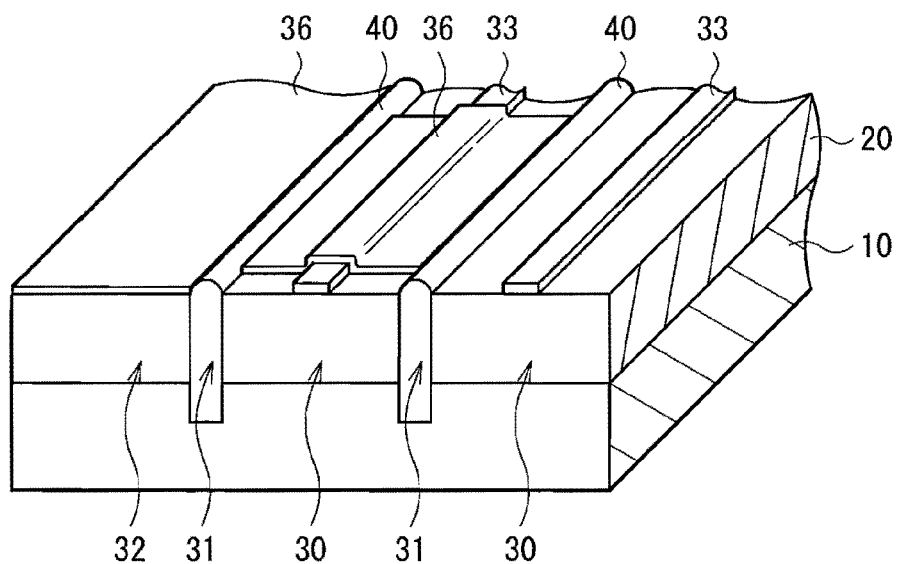
FIG. 6 is a perspective view for explaining a step following FIG. 5.
Figure 7:
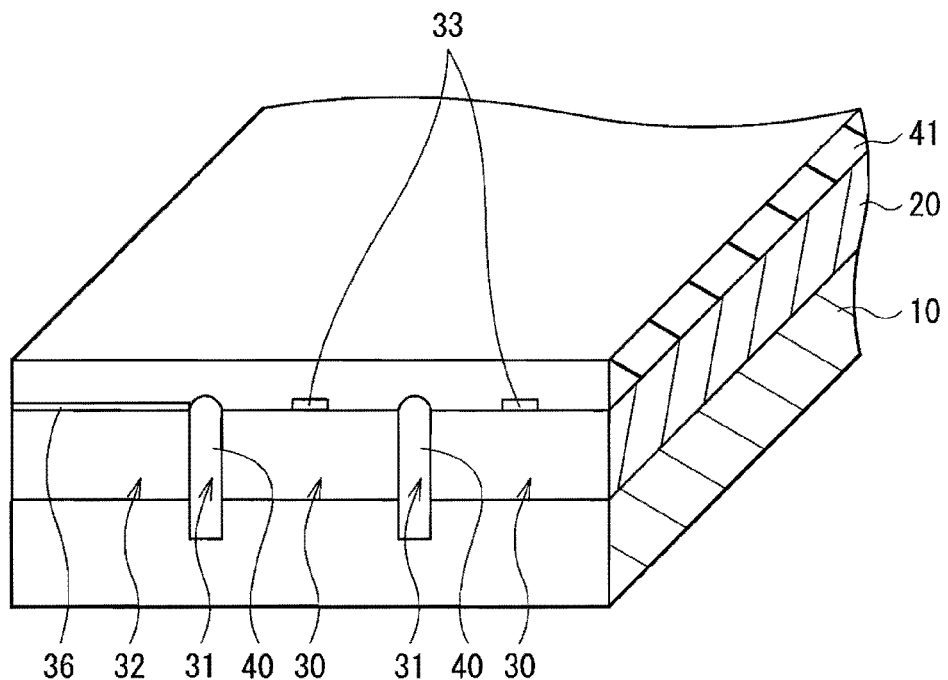
FIG. 7 is a perspective view for explaining a step following FIG. 6.

Next, after a resist layer 40 is formed on the whole surface (FIG. 5), exposure and development of the resist layer 40 are performed so that at least inside of the trench 31 is filled therewith and the upper electrode 33 is not covered therewith. Thereby, the resist layer 40 is left in the trench 31. After that, the left resist layer 40 is cured by a given method. Thereby, the top face of the left resist layer 40 (sacrifice layer) becomes a curved face projecting toward the opposite side of the bottom face of the trench 31 in the lateral direction (direction crossing the extension direction of the trench 31) (FIG. 6).

Figure 8:
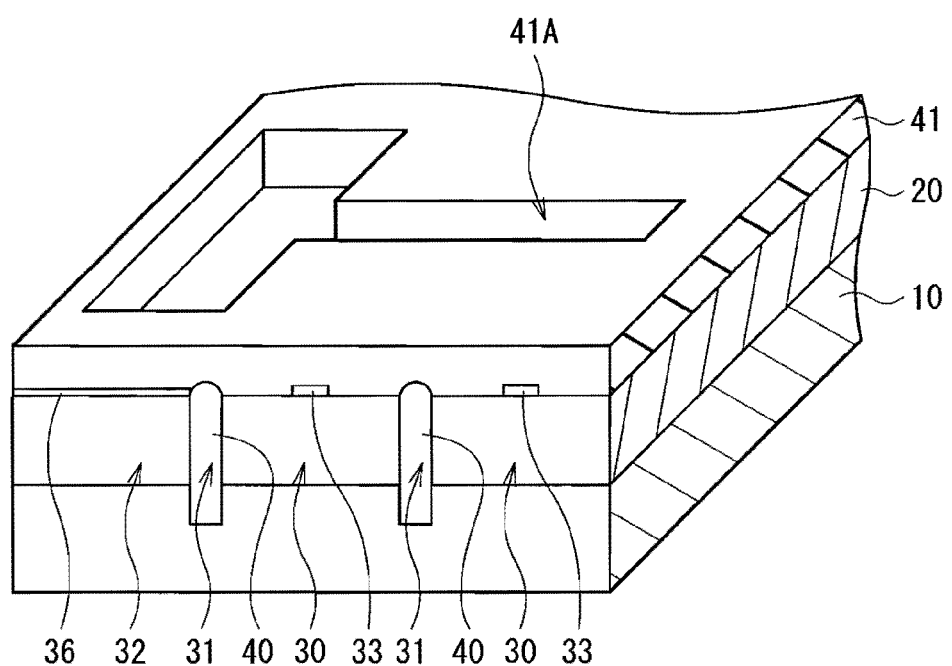
FIG. 8 is a perspective view for explaining a step following FIG. 7.
Figure 9A:
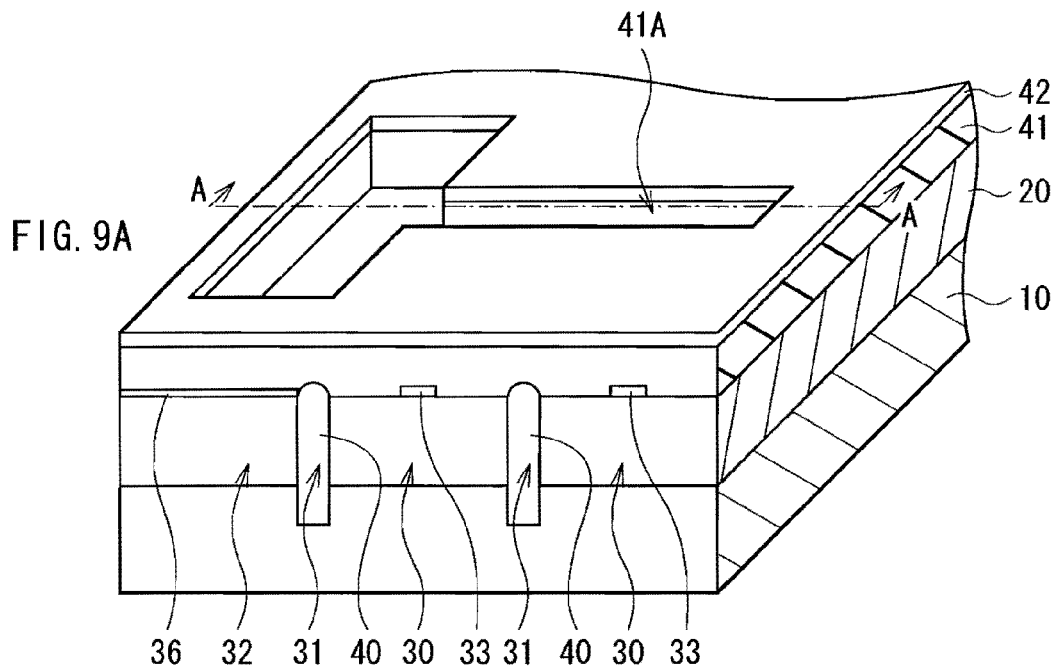
FIGS. 9A and 9B are a perspective view and a cross sectional view, respectively, for explaining a step following FIG. 8.
Figure 9B:
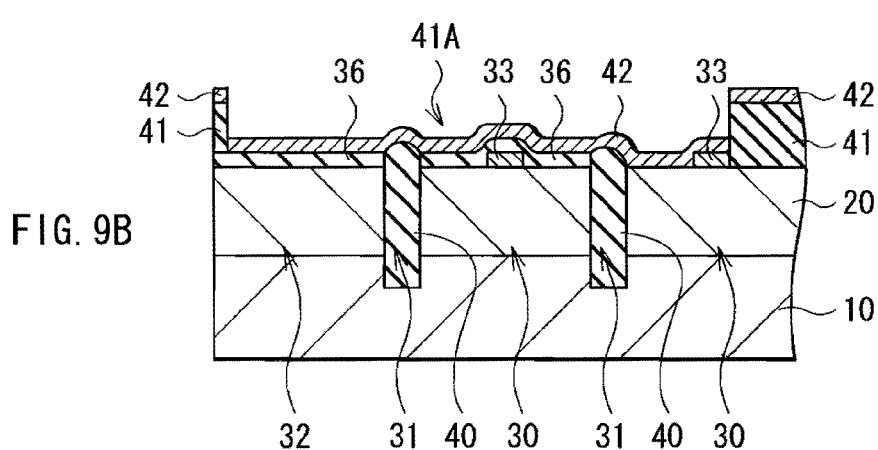

Next, after a resist layer 41 is formed on the whole surface (FIG. 7), exposure and development of the resist layer 41 are performed, and thereby an aperture 41A is formed in a region to subsequently become the pad electrode 34 and the wiring layer 35 (FIG. 8). At this time, part of the top face of the foregoing resist layer 40 is exposed on the bottom face of the aperture 41A. Next, for example, a metal layer 42 is formed on the whole surface by using, for example, evaporation or the like (FIGS. 9A and 9B). As described above, by forming part of the metal layer 42 on the surface of the left resist layer 40 according to needs, out of the metal layer 42, the section formed on the surface of the left resist layer 40 becomes in the shape of an arch.

Next, for example, an excess section out of the metal layer 42 is removed together with the resist layer 41 by using, for example, liftoff or the like, and thereby the pad electrode 34 and the wiring layer 35 are formed. Further, the left resist layer 40 is removed by a given method. In result, the wiring layer 35 becomes in the shape of an arch and is formed in the air at least over the trench 31. Accordingly, the laser diode 1 of this embodiment is manufactured.

Next, a description will be given of action and effect of the laser diode 1 of this embodiment.

In the laser diode 1 of this embodiment, in the case where a given voltage is applied to between the upper electrode 33 and the lower electrode 37, a current is injected into the current injection region (light emission region 22A) of the active layer 22, and thereby light emission is generated due to electron-hole recombination. The light is reflected by the pair of the front end face S1 and the rear end face S2, laser oscillation with a given wavelength is generated, and the light is radiated outside from the front end face S1 of each ridge section 30, as a laser beam.

In this embodiment, the trench 31 is provided between the ridge sections 30 adjacent to each other. Further, the wiring layer 35 that electrically connects the upper electrode 33 to the pad electrode 34 is arranged in the air at least over the trench 31. That is, in this embodiment, a filler such as an insulating material is not provided in a clearance between the wiring layer 35 and the inner walls of the trench 31. Thus, there is no possibility that a stress generated in the case where the filler such as the insulating material is provided in the clearance between the wiring layer 35 and the inner walls of the trench 31 is not generated in the ridge section 30. Therefore, rotation of a polarization angle resulting from the stress applied to the ridge section 30 is able to be inhibited.

The laser diode 1 of this embodiment is a narrow pitch type laser in which the beam pitch is about several tens of μm. Thus, it is extremely difficult to form the wiring layer 35 by wire bonding. If trial is made to form the wiring layer 35 by wire bonding, one wire ball is contacted with a plurality of upper electrodes 33, and there is a high possibility that each ridge section 30 is not able to be driven independently. Further, since ultrasonic bonding is used in wire bonding, there is a possibility that lowering of reliability resulting from ultrasonic is caused. Accordingly, in this embodiment, the wiring layer 35 is formed by film formation. Thereby, a state that each wiring layer 35 is contacted with each other and each ridge section 30 is not able to be driven independently, is prevented. Further, lowering of reliability resulting from ultrasonic is prevented.

Further, in this embodiment, if the wiring layer 35 is in the shape of an arch at least over the trench 31, there is no possibility that the wiring layer 35 is bent. In result, reliability is able to be further improved. As a method of forming the wiring layer 35 in the shape of an arch, as described above, it is preferable to use the two stage exposure in which the resist layer 40 that has been firstly exposed and developed is left in the trench 31, and the wiring layer 35 is formed with the use of the left resist layer as a base. By using the two stage exposure, the wiring layer 35 is able to be surely in the shape of an arch at least over the trench 31, and high reliability is able to be obtained.

Second Embodiment

Figure 10:
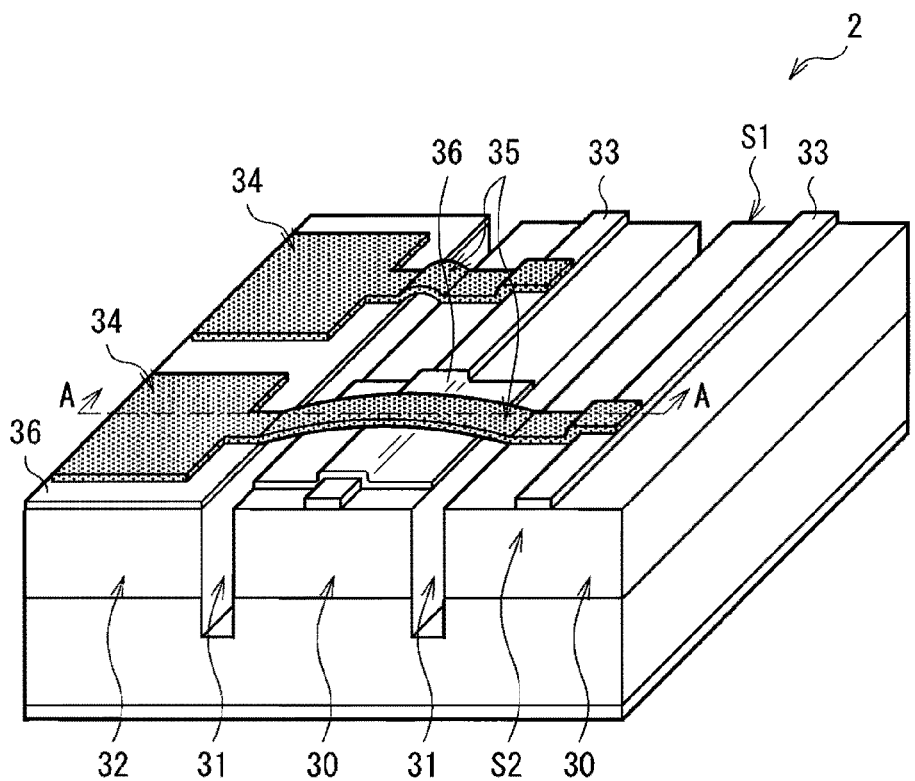
FIG. 10 is a perspective view of a laser diode according to a second embodiment of the invention.
Figure 11:
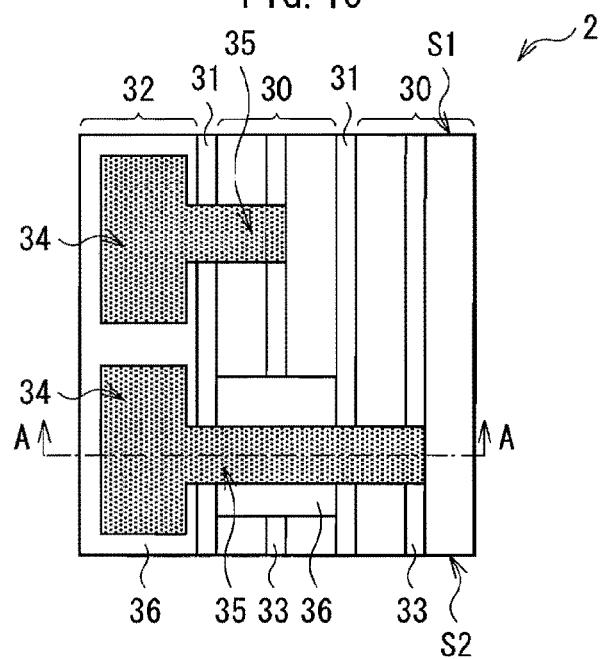
FIG. 11 is a top view of the laser diode of FIG. 10.
Figure 12:
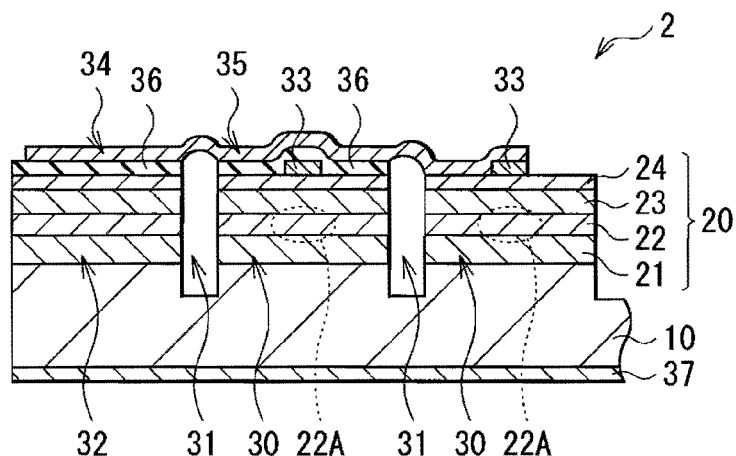
FIG. 12 is a cross sectional view taken along arrow A-A of the laser diode of FIG. 10 or FIG. 11.

FIG. 10 is a perspective view illustrating an example of schematic structure of a laser diode 2 according to a second embodiment of the invention. FIG. 11 illustrates an example of top face structure of the laser diode 2 of FIG. 10. FIG. 12 illustrates an example of cross sectional structure taken along arrow A-A of the laser diode 2 of FIG. 10 or FIG. 11.

The laser diode 2 according to this embodiment is a multi-beam laser diode including a plurality of stripe-like emitters, and is an edge emitting type laser diode in which a laser beam is radiated from an end face of each emitter, as that of the foregoing embodiment is. What the laser diode 2 and the laser diode 1 of the foregoing embodiment have in common is that the laser diode 2 is formed by a method similar to that of the foregoing embodiment. However, the laser diode 2 is different from the laser diode 1 of the foregoing embodiment in that the all pad electrodes 34 are formed only in one region out of the two regions sandwiching the ridge sections 30 and the trenches 31 from the both sides. Thus, a description will be hereinafter mainly given of points different from the foregoing embodiment, and a description of the points common to those of the foregoing embodiment will be omitted as appropriate.

Figure 13:
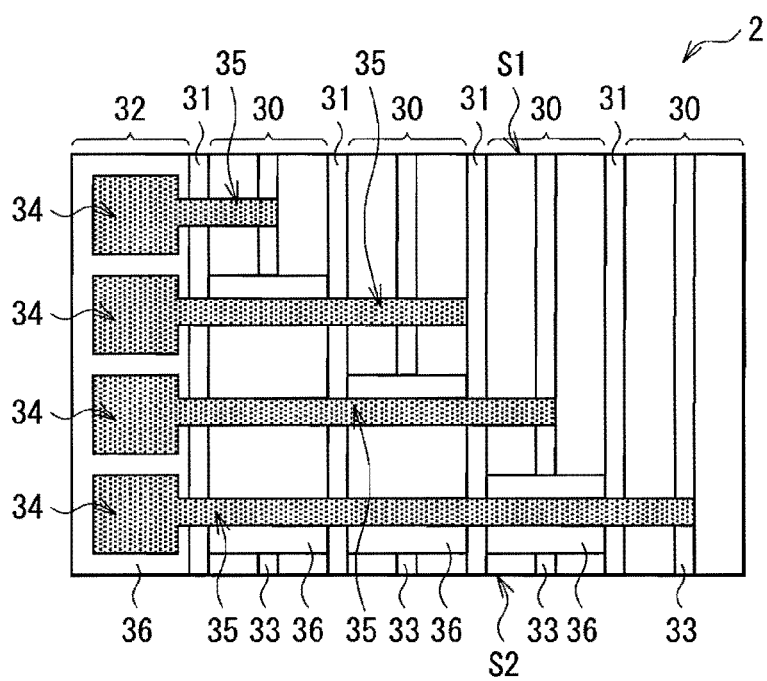
FIG. 13 is a top view of a modified example of the laser diode of FIG. 10.

In this embodiment, the semiconductor layer 20 is provided on the substrate 10 in the same manner as that of the foregoing embodiment. In the semiconductor layer 20, two or more strip-like ridge sections 30 are arranged in parallel with each other. Though FIG. 10 to FIG. 12 exemplify a case that the number of the ridge sections 30 is two, the number of the ridge sections 30 may be three. Otherwise, the number of the ridge sections 30 may be four as illustrated in FIG. 13, or may be five or more though not illustrated.

The seat section 32 and a section directly below the seat section 32 out of the substrate 10 (hereinafter simply referred to as "the seat section 32 and the section directly below the seat section 32") may be singly provided in the two regions sandwiching the ridge section 30 and the trench 31 from the both sides in the same manner as that of the foregoing embodiment. Otherwise, for example, as illustrated in FIG. 10 to FIG. 12, the seat section 32 and the section directly below the seat section 32 may be provided only in one region out of the foregoing two regions. In the case where the seat section 32 and the section directly below the seat section 32 are singly provided in the foregoing two regions, it is possible that each thereof has the same size, or one is wide and the other is narrow.

In this embodiment, as described above, the all pad electrodes 34 are formed only in one region out of the two regions sandwiching the ridge section 30 and the trench 31 from the both sides, and are assembled on one side with respect to the ridge section 30 and the trench 31. In the case where the seat section 32 and the section directly below the seat section 32 are singly provided in the two regions sandwiching the ridge section 30 and the trench 31 from the both sides, the all pad electrodes 34 are formed only on one seat section 32. At this time, in the case where each size of both seat sections 32 is different from each other, the all pad electrodes 34 are preferably provided only on the wider seat section 32. Further, in the case where the seat section 32 and the section directly below the seat section 32 are provided only in one region out of the foregoing two regions, the all pad electrodes 34 are provided only on such a seat section 32. In any case, the all pad electrodes 34 are formed only on one side with respect to the ridge section 30 and the trench 31.

Figure 14A:
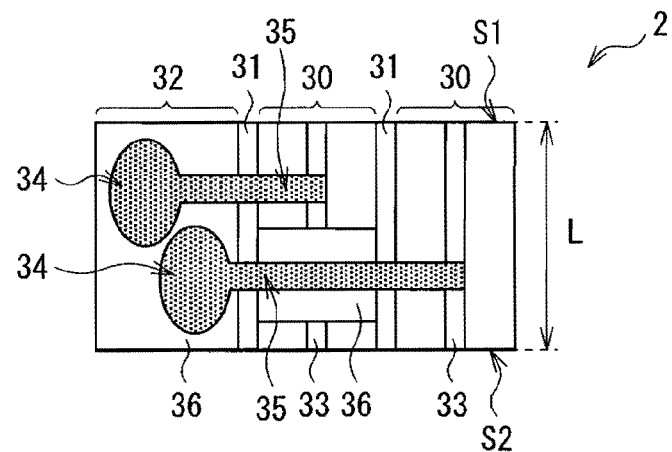
FIGS. 14A and 14B are top views of another modified example of the laser diode of FIG. 10.
Figure 14B:
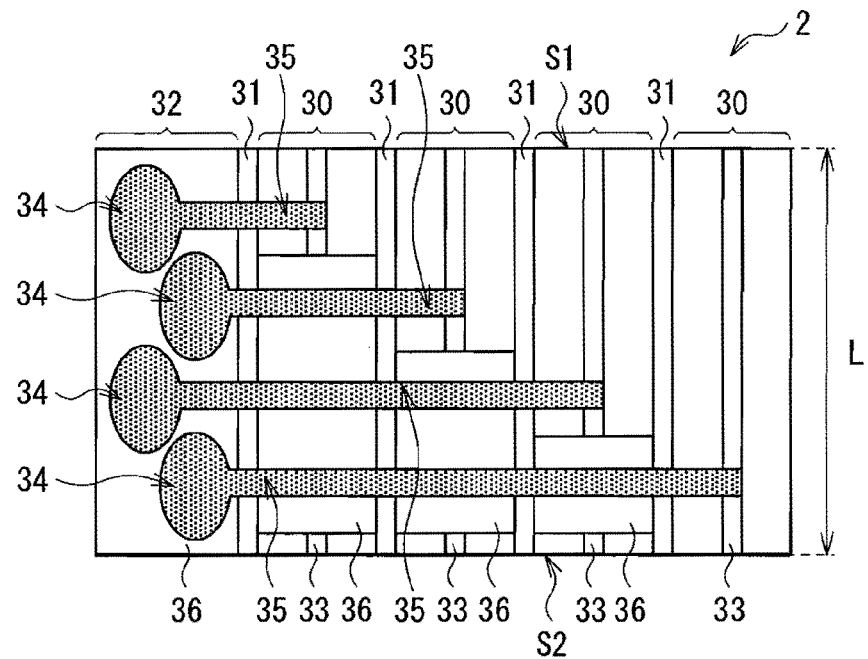
Figure 15A:
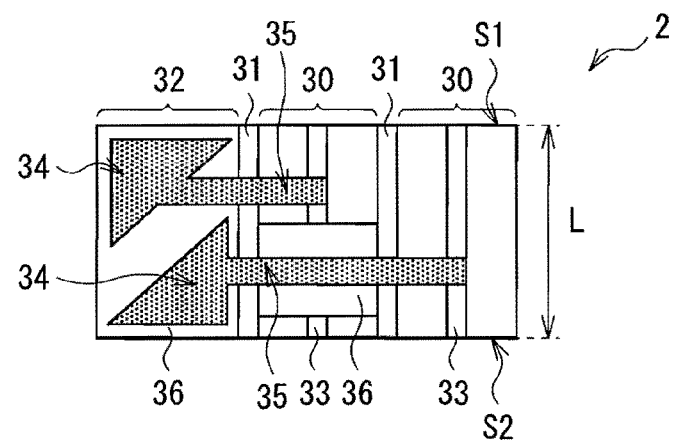
FIGS. 15A and 15B are top views of still another modified example of the laser diode of FIG. 10.
Figure 15B:
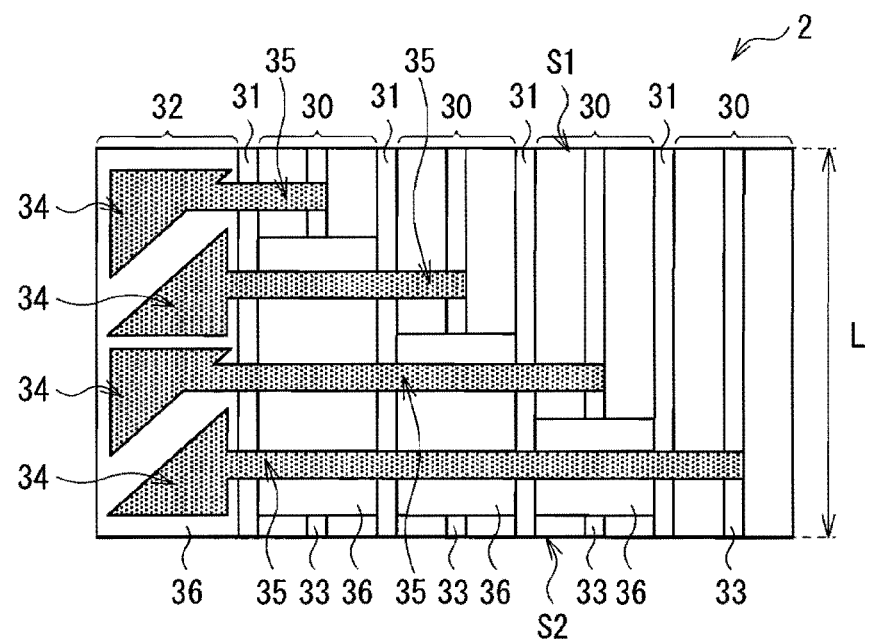
Figure 16A:
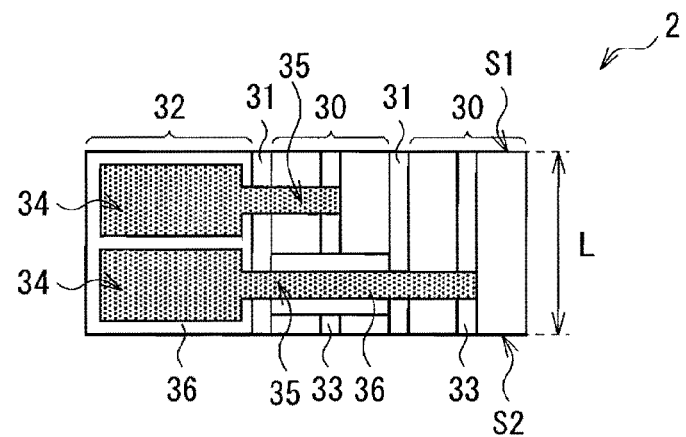
FIGS. 16A and 16B are top views of still another modified example of the laser diode of FIG. 10.
Figure 16B:
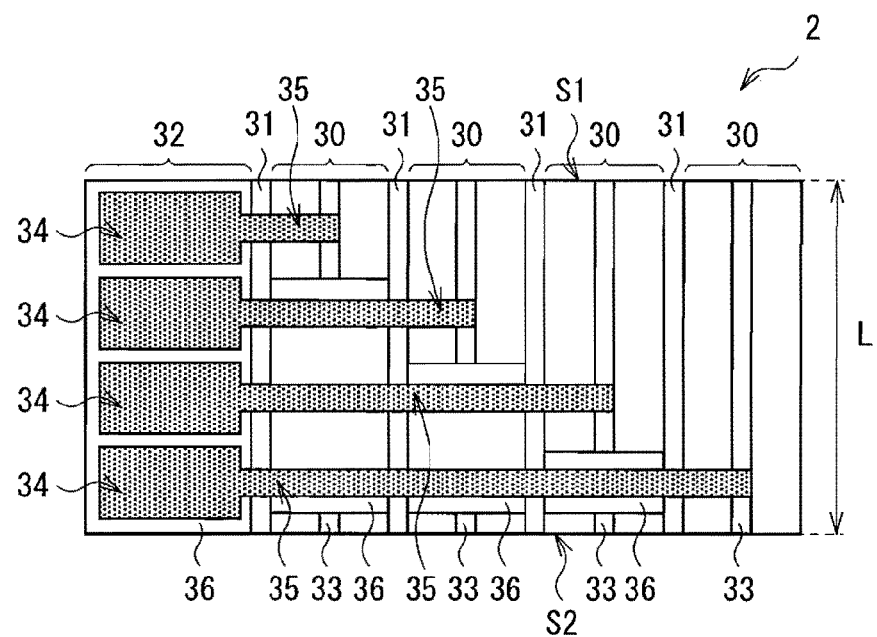

For example, as illustrated in FIG. 10 and FIG. 11, the plurality of pad electrodes 34 are arranged in line in the direction in parallel with the ridge section 30. For example, as illustrated in FIG. 10 and FIG. 11, the pad electrodes 34 are in the shape of a quadrangle extending in the extension direction of the ridge section 30. The pad electrode 34 may have other shape. For example, as illustrated in FIGS. 14A and 14B, the pad electrode 34 may be in the shape of a circle or an oval. Further, for example, as illustrated in FIGS. 15A and 15B, the pad electrode 34 may be in the shape of a triangle. Further, for example, as illustrated in FIGS. 16A and 16B, the pad electrode 34 may be in the shape of a quadrangle extending in the direction crossing (for example, perpendicular to) the extension direction of the ridge section 30. Further, for example, though not illustrated, the pad electrode 34 may be in the shape of a polygon. Further, for example, as illustrated in FIGS. 14A, 14B, 15A, and 15B, the plurality of pad electrodes 34 may be arranged alternately (staggeringly) in the extension direction of the ridge section 30.

Next, a description will be given of an example of a method of manufacturing the laser diode 2 of this embodiment. First, on the substrate 10, the two or more strip-like ridge sections 30 are formed in parallel with each other with the strip-like trench 31 in between. At this time, the ridge section 30 and the trench 31 are formed so that the width W1 of the trench 31 is narrower than the width W2 of the ridge section 30. Next, after the upper electrode 33 is formed on each ridge section 30, the insulating layer 36 is formed in a given region.

Next, after the resist layer 40 is formed on the whole surface, exposure and development of the resist layer 40 are performed so that at least inside of the trench 31 is filled therewith and the upper electrode 33 is not covered therewith. Thereby, the resist layer 40 is left in the trench 31. After that, the left resist layer 40 is cured by a given method. Thereby, the top face of the left resist layer 40 (sacrifice layer) becomes a curved face projecting toward the opposite side of the bottom face of the trench 31 in the lateral direction (direction crossing the extension direction of the trench 31).

Next, after the resist layer 41 is formed on the whole surface, exposure and development of the resist layer 41 are performed, and thereby an aperture in a given shape is formed only in one region out of the two regions sandwiching the ridge section 30 and the trench 31 from the both sides, and a strip-like aperture communicated with the foregoing aperture is formed. Accordingly, the aperture 41A is formed in a region where the pad electrode 34 and the wiring layer 35 are to be subsequently formed. At this time, part of the top face of the foregoing resist layer 40 is exposed on the bottom face of the aperture 41A. Next, for example, the metal layer 42 is formed on the whole surface by using, for example, evaporation or the like. As described above, by forming part of the metal layer 42 on the surface of the left resist layer 40 according to needs, out of the metal layer 42, a section formed on the surface of the left resist layer 40 becomes in the shape of an arch.

Next, an excess section of the metal layer 42 is removed together with the resist layer 41 by using, for example, liftoff or the like, and thereby the pad electrode 34 is formed only in one region out of the two regions sandwiching the ridge section 30 and the trench 31 from the both sides, and the wiring layer 35 coupled with the pad electrode 34 is formed. Further, the left resist layer 40 is removed by a given method. In result, the wiring layer 35 becomes in the shape of an arch and is formed in the air at least over the trench 31. Accordingly, the laser diode 2 of this embodiment is manufactured.

In this embodiment, the trench 31 is provided between the ridge sections 30 adjacent to each other in the same manner as that of the foregoing embodiment. Further, the wiring layer 35 that electrically connects the upper electrode 33 to the pad electrode 34 is arranged in the air at least over the trench 31. That is, in this embodiment, a filler such as an insulating material is not provided in a clearance between the wiring layer 35 and the inner walls of the trench 31. Thus, there is no possibility that a stress generated in the case where the filler such as the insulating material is provided in the clearance between the wiring layer 35 and the inner walls of the trench 31 is not generated in the ridge section 30. Therefore, rotation of a polarization angle resulting from the stress applied to the ridge section 30 is able to be inhibited.

The laser diode 2 of this embodiment is a narrow pitch type laser in which the beam pitch is about several tens of μm as the foregoing embodiment is. Thus, since it is extremely difficult to form the wiring layer 35 by wire bonding, the wiring layer 35 is formed by film formation. Thereby, a state that each wiring layer 35 is contacted with each other and each ridge section 30 is not able to be driven independently, is prevented. Further, lowering of reliability resulting from ultrasonic is prevented.

Further, in this embodiment, in the case where the wiring layer 35 is in the shape of an arch at least over the trench 31, there is no possibility that the wiring layer 35 is bent. In result, reliability is able to be further improved. As a method of forming the wiring layer 35 in the shape of an arch, as described above in the foregoing embodiment, it is preferable to use the two stage exposure in which the resist layer 40 that has been firstly exposed and developed is left in the trench 31, and the wiring layer 35 is formed with the use of the left resist layer as a base. By using the two stage exposure, the wiring layer 35 is able to be surely in the shape of an arch at least over the trench 31, and high reliability is able to be obtained.

Further, in this embodiment, the all pad electrodes 34 are assembled on one side with respect to the ridge section 30 and the trench 31. Thus, for example, in the case where the seat section 32 and the section directly below the seat section 32 are singly provided in the two regions sandwiching the ridge section 30 and the trench 31 from the both sides, and the size of one seat section 32 is smaller than the size of the seat section 32 in the foregoing embodiment, if the all pad electrodes 34 are formed only on the wider seat section 32, the chip size of the laser diode 2 is able to be smaller than that of the foregoing embodiment while an area necessary for the pad electrode 34 is secured.

Further, in this embodiment, for example, in the case where the seat section 32 and the section directly below the seat section 32 are provided only in one region out of the two regions sandwiching the ridge section 30 and the trench 31 from the both sides, and the all pad electrodes 34 are provided only on such a relevant seat section 32, the chip size of the laser diode 2 is able to be decreased by the portion obtained by omitting one seat section 32 and the section directly below the omitted seat section 32 while an area necessary for the pad electrode 34 is secured. Further, in the case where the all pad electrodes 34 are arranged alternately (staggeringly) in the extension direction of the ridge section 30, or in the case where the all pad electrodes 34 are in the shape crossing (for example, perpendicular to) the extension direction of the ridge section 30, as illustrated in FIGS. 14A, 14B to FIG. 16A, 16B, a resonator length L of the laser diode 2 is not necessarily long. Thus, the chip size of the laser diode 2 is able to be minimized while an area necessary for the pad electrode 34 is secured.

Modified Example

Figure 17:
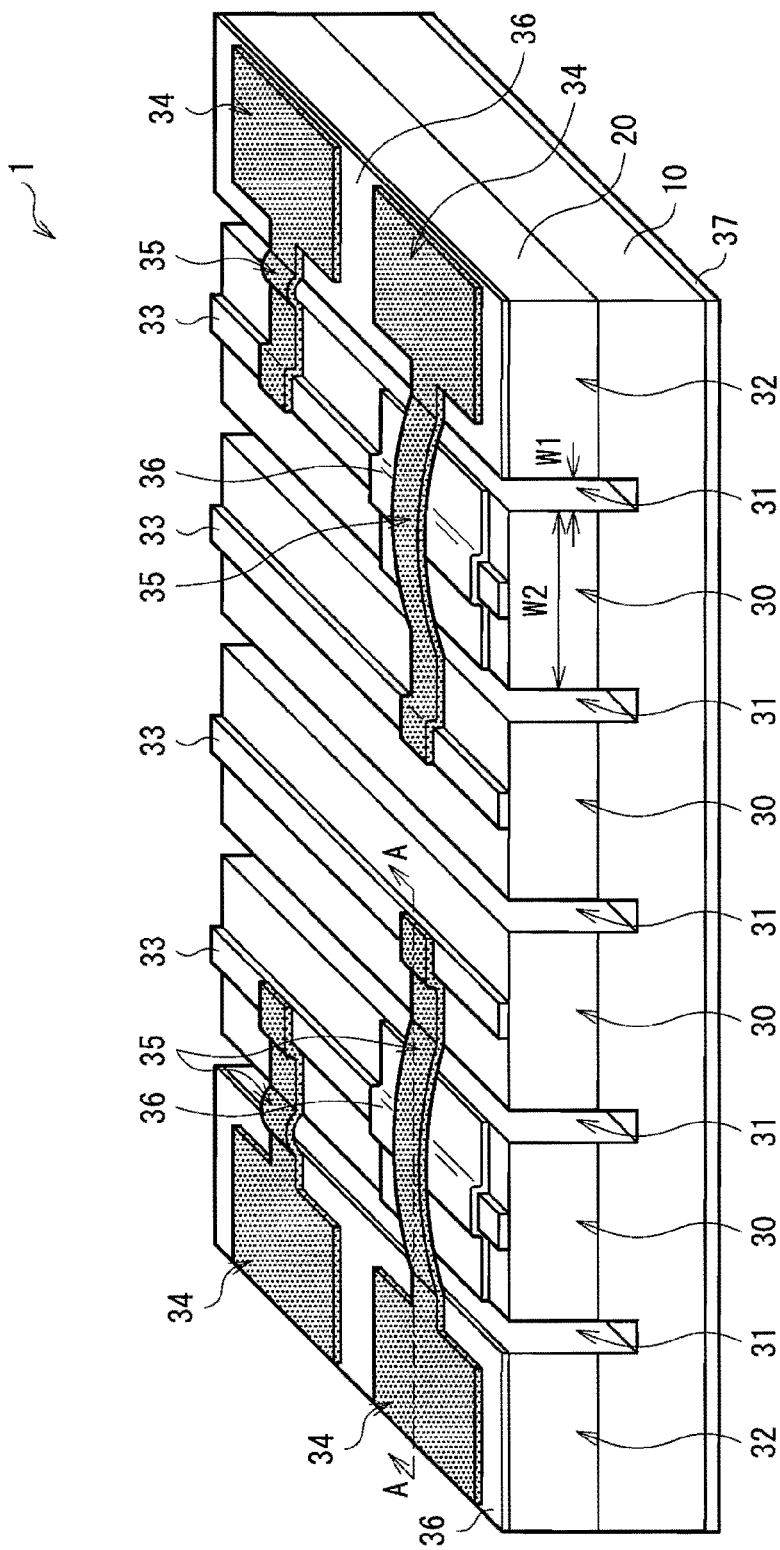
FIG. 17 is a perspective view of a modified example of the laser diode of FIG. 1.

In the foregoing respective embodiments, the wiring layer 35 is structured to overjump one trench 31 at a time. However, the wiring layer 35 may be structured to overjump a plurality of trenches 31 at a time. For example, as illustrated in FIG. 17, the wiring layer 35 may be structured to overjump two trenches 31 at a time. However, in this case, at least a section arranged in the air out of the wiring layer 35 is preferably in the shape of an arch.

Figure 18:
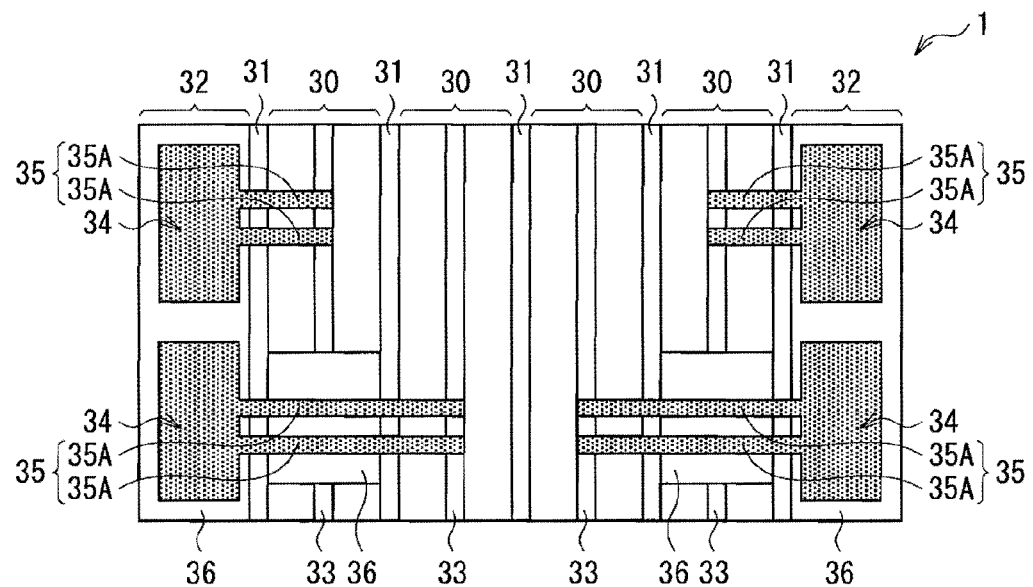
FIG. 18 is a perspective view of another modified example of the laser diode of FIG. 1.
Figure 19:
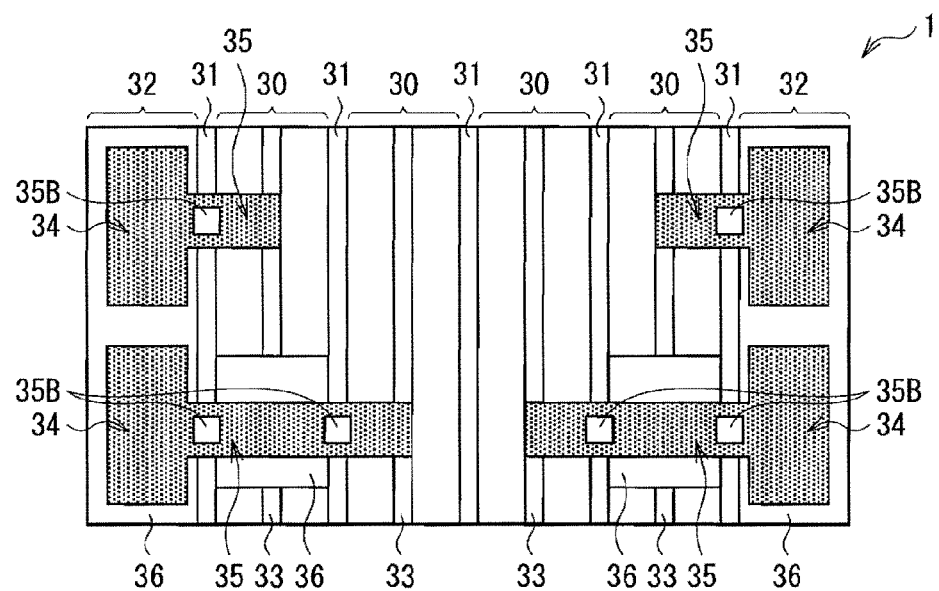
FIG. 19 is a perspective view of still another modified example of the laser diode of FIG. 1.

Further, in the foregoing respective embodiments, the respective wiring layers 35 are configured of a single wiring. However, the wiring layer 35 may be configured of two or more fine wirings 35A that are arranged in parallel with each other with a given clearance in between. For example, as illustrated in FIG. 18, the respective wiring layers 35 may be configured of the two fine wirings 35A that are arranged in parallel with each other with a given clearance in between. Further, in the foregoing respective embodiments, the respective wiring layers 35 may be provided with an aperture 35B (through hole) in a region opposed to the trench 31. For example, as illustrated in FIG. 19, the respective wiring layers 35 may be provided singly with one aperture 35B (through hole) in each region opposed to the trench 31. In this case, in the manufacturing process, the resist layer 40 left immediately below the respective wiring layers 35 is able to be removed easily in a short time. Even in the case where the respective wiring layers 35 are configured of two or more fine wirings 35A, or the respective wiring layers 35 are provided with the aperture 35B, an increase amount of the resistance value of the respective wiring layers 35 is able to be minimized compared to a case that each wiring layer 35 is configured of a single wiring.

Figure 20:
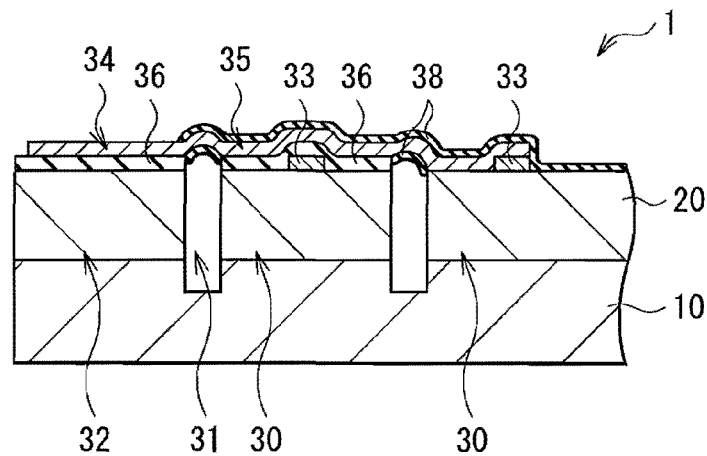
FIG. 20 is a perspective view of still another modified example of the laser diode of FIG. 1.

Further, in the foregoing respective embodiments, the case that the respective wiring layers 35 are exposed is exemplified. However, at least the surface of the section arranged in the air out of the respective wiring layers 35 may be covered with an insulating film 38 such as SiN. For example, as illustrated in FIG. 20, the surface of the section exposed outside out of the respective wiring layers 35 may be covered with the insulating film 38 such as SiN. Thereby, ion migration is able to be prevented, and the respective wiring layers 35 are able to be protected from outside environment.

Figure 21:
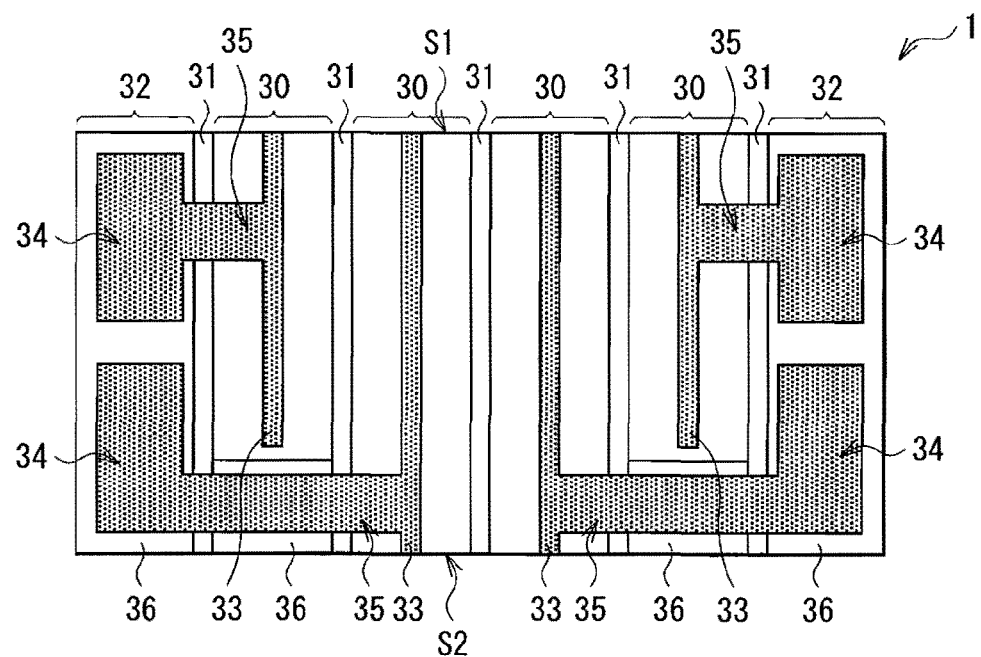
FIG. 21 is a perspective view of still another modified example of the laser diode of FIG. 1.

Further, in the foregoing respective embodiments, the case that the upper electrode 33 is formed in a step different from the step of forming the wiring layer 35 and the pad electrode 34 is exemplified. However, the upper electrode 33 may be formed together with the wiring layer 35 and the pad electrode 34 in block in the same step as the step of forming the wiring layer 35 and the pad electrode 34. However, in this case, the upper electrodes 33 on the ridge sections 30 other than the central ridge section 30 are formed in the same plane as that of the wiring layer 35 electrically connected with the upper electrode 33 on the central ridge section 30. Thus, for example, as illustrated in FIG. 21, it is preferable that the end section on the rear end face S2 side of the upper electrodes 33 on the ridge sections 30 other than the central ridge section 30 are slightly retreated toward the front end face S1 side, the wiring layer 35 electrically connected to the upper electrode 33 on the central ridge section 30 is arranged in the space region obtained by the foregoing retreat (that is, region in the vicinity of the rear end face S2 out of the top face of the ridge section 30). Thereby, not only short circuit thereof is able to be prevented, but also the region into which a current is not injected is able to be located farthest from the light radiation side, and influence on laser characteristics is able to be inhibited to the minimum.

While descriptions have been hereinbefore given of the invention with reference to the plurality of embodiments and the modified examples thereof, the invention is not limited to the foregoing respective embodiments and the like, and various modifications may be made.

For example, in the foregoing respective embodiments and the like, the description has been given of the laser diode 1 in which the seat sections 32 are provided on the both sides of the ridge sections 30. However, the seat sections 32 may be omitted. In this case, the pad electrode 34 may be formed in an exposed section generated by omitting the seat sections 32 out of the top face of the substrate 10.

Further, in the foregoing respective embodiments and the like, the descriptions have been given by taking the AlGaAs compound laser diode as an example. However, the invention is able to be applied to other compound laser diode, for example, a red laser diode such as an AlGaInP compound laser diode and a GaInAsP compound laser diode; a gallium nitride laser diode such as a GaInN compound laser diode and an AlGaInN compound laser diode; and a Group II-VI laser diode such as a ZnCdMgSSeTe compound laser diode. Further, the invention is able to be applied to a laser diode in which the oscillation wavelength is not limited to the visible range such as an AlGaAs laser diode, an InGaAs laser diode, an InP laser diode, and a GaInAsNP laser diode.

The present application contains subject matter related to that disclosed in Japanese Priority Patent Application JP 2008-279861 filed in the Japan Patent Office on Oct. 30, 2008, and Japanese Priority Patent Application JP 2009-131264 filed in the Japan Patent Office on May 29, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a laser diode comprising:
a first step of forming on a semiconductor substrate, three or more strip-like ridge sections in parallel with each other with a strip-like trench in between, the three or more strip-like ridge sections including at least a lower cladding layer, an active layer, and an upper cladding layer in this order from the semiconductor substrate side;
a second step of forming a sacrificial layer that fills in at least an inside of the trench and that does not cover a whole top face of the ridge section, subsequently forming a wiring layer electrically connected to the upper cladding layer on the sacrificial layer according to needs, and forming a pad electrode electrically connected to the upper electrode through the wiring layer, in a region different from regions of both the ridge section and the trench; and
a third step of removing the sacrificial layer.

2. The method of manufacturing a laser diode according to claim 1, wherein in the first step, after the ridge section and the trench are formed, an upper electrode electrically connected to the upper cladding layer is formed on a top face of the respective ridge sections.

3. The method of manufacturing a laser diode according to claim 1, wherein in the second step, an upper electrode electrically connected to the upper cladding layer is formed on a top face of the respective ridge sections together with the wiring layer and the pad electrode in block.

4. The method of manufacturing a laser diode according to claim 1, wherein in the second step, the wiring layer is formed by film formation.

5. A method of manufacturing a laser diode comprising:
a first step of forming on a semiconductor substrate, two strip-like ridge sections in parallel with each other with a strip-like trench in between, the two strip-like ridge sections including at least a lower cladding layer, an active layer, and an upper cladding layer in this order from the semiconductor substrate side;
a second step of forming a sacrificial layer that fills in at least an inside of the trench and that does not cover a whole top face of the ridge section, subsequently forming a wiring layer electrically connected to the upper cladding layer on the sacrificial layer according to needs, and forming a pad electrode electrically connected to the upper electrode through the wiring layer, only in one region out of two regions sandwiching the ridge section and the trench from the both sides; and
a third step of removing the sacrificial layer.

* * * * *